United States Patent [19]

Lee et al.

[11] Patent Number: 5,818,285

[45] Date of Patent: Oct. 6, 1998

[54] FUSE SIGNATURE CIRCUITS FOR MICROELECTRONIC DEVICES

[75] Inventors: Sang-Kil Lee; Young-Sik Seok, both of Kyungki-do, Rep. of Korea

[73] Assignee: Samsung Electronics Co., Ltd., Suwon, Rep. of Korea

[21] Appl. No.: 668,346

[22] Filed: Jun. 26, 1996

[30] Foreign Application Priority Data

Jun. 30, 1995 [KR] Rep. of Korea ...................... 95-18973

[51] Int. Cl.$^6$ ................................................. H03K 19/007
[52] U.S. Cl. ........................ 327/525; 326/10; 365/225.7
[58] Field of Search ................................. 327/525, 526; 326/10, 13, 14; 365/225.7; 324/550; 371/21.1

[56] References Cited

U.S. PATENT DOCUMENTS

| | | | |
|---|---|---|---|
| 4,806,793 | 2/1989 | Golab | 327/525 |
| 4,896,055 | 1/1990 | Fujii et al. | 307/442 |
| 5,051,691 | 9/1991 | Wang | 324/158 |
| 5,345,110 | 9/1994 | Renfro et al. | 327/525 |
| 5,420,456 | 5/1995 | Galbi et al. | 327/525 |
| 5,471,429 | 11/1995 | Lee et al. | 365/201 |
| 5,617,366 | 4/1997 | Yoo | 365/225.7 |

*Primary Examiner*—Timothy P. Callahan
*Assistant Examiner*—Eunja Shin
*Attorney, Agent, or Firm*—Myers, Bigel, Sibley & Sajovec

[57] ABSTRACT

A fuse signature circuit for a microelectronic device includes a fuse circuit and a sensing circuit. The fuse circuit includes a fuse which can be cut electrically in response to a cut control signal, and the fuse circuit generates a fuse state signal indicating if the fuse has been cut. The sensing circuit generates an output signal responsive to the fuse state signal.

21 Claims, 2 Drawing Sheets

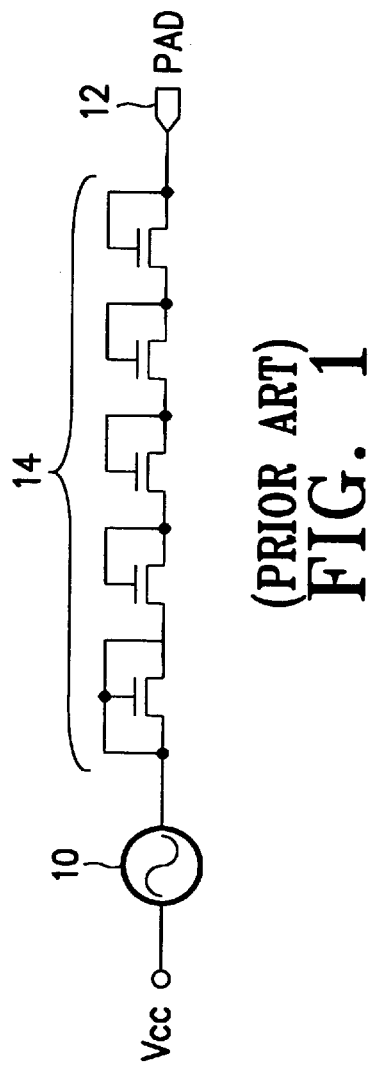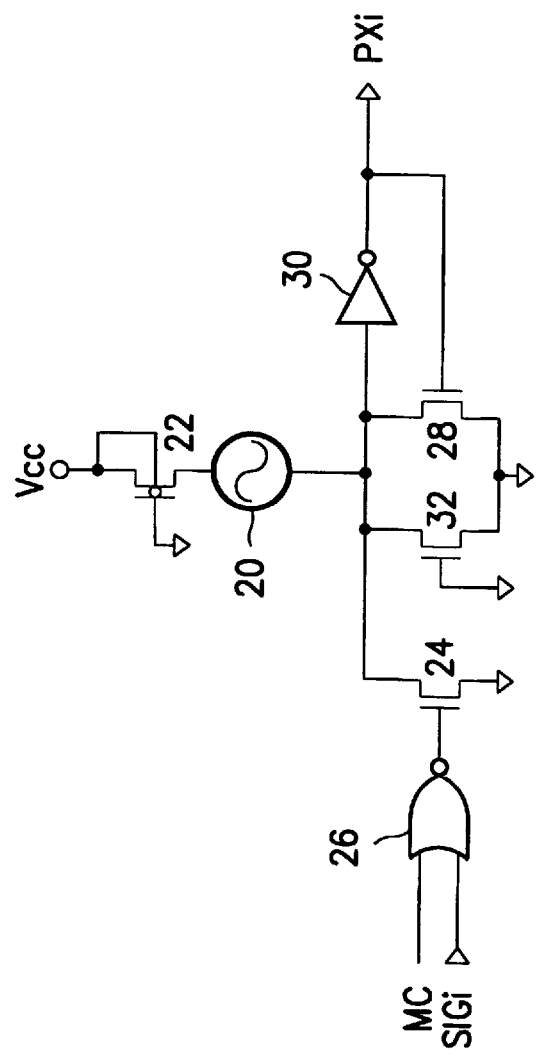

FUSE SIGNATURE CIRCUITS FOR MICROELECTRONIC DEVICES

FIELD OF THE INVENTION

The present invention relates to the field of microelectronic devices and more particularly to the field of fuses for microelectronic devices.

BACKGROUND OF THE INVENTION

In many highly integrated microelectronic memory devices, different operating modes can be selected on the semiconductor chip before packaging. For example, a memory device may be provided with the option to operate according to various modes of operation such as page mode, nibble mode, and static mode. In such a memory device, the desired operating mode may be chosen by cutting a predetermined fuse or fuses.

Furthermore, fuses have been used to select among delay options, and current level options. Fuses have also been used to repair memory devices including defective memory cells. Accordingly, fuse signature circuits have been developed to check whether a desired fuse has been cut. Such a signature circuit may be particularly desirable in a memory device including a large number of fuses.

A schematic diagram of a conventional fuse signature circuit for a memory device is illustrated in FIG. 1. This circuit includes a fuse 10, a pad 12, and a bias circuit 14. The fuse 10 is connected to the supply voltage Vcc at one node thereof. The bias circuit 14 includes one or more NMOS transistors connected as diodes between the pad 12 and a second node of the fuse 10. The fuse 10 is made of a material such as polysilicon which can be cut on the wafer. In particular, the fuse can be cut by a laser beam or by supplying an electrical current through the transistors and the bias circuit 14.

As discussed above, a memory device often includes a plurality of fuses, and these fuses can be used to select the mode of operation for the memory device. In addition, fuses can be used in a row/column redundancy fuse box to substitute a defective memory cell with a redundant memory cell. In a row repair operation, for example, a fuse related to a defective row address is first cut, and then a fuse in the signature circuit related to a predetermined address pad is cut. The step of cutting the fuse can be performed with a laser prior to dicing the individual memory device from the production wafer. By applying a relatively high voltage to the pad 12 of the fuse signature circuit associated with the fuse to be checked, and then measuring the electrical current flow at the pad, the state of the fuse can be checked. The completion of a row repair operation can thus be checked by determining whether the fuse corresponding to the defective row address has been cut.

In order to check whether or not a desired fuse has been cut, a voltage greater than "4 Vtn+Vcc" (wherein Vtn is the threshold voltage of one NMOS transistor) is applied to the pad 12 of the signature circuit corresponding to the fuse to be checked. The electrical current at the pad is then measured. If a voltage greater than "4 Vtn+Vcc" is applied to the pad 12 when the fuse 10 has not been cut, an electrical current flows through the current path from the pad 12 to the supply voltage Vcc. On the other hand, if a voltage is applied to the pad 12 when the fuse 10 has been cut, there will be no current flow. Accordingly, by applying an appropriate voltage to the pad 12 and measuring the resulting current, the status of a fuse (whether or not the fuse has been cut) can be checked.

By checking the status of a fuse as discussed above, it can be determined which row redundancy and column redundancy cells have been used in a repair. It can also be determined indirectly whether a signal provided from outside the chip is correctly input or output to/from the pad.

As discussed above, a memory device fuse can be cut on the wafer prior to dicing, and the status of this fuse can be checked by using the conventional fuse signature circuit. In particular, by applying a predetermined voltage to a pad on the signature circuit, the resulting current can be used to determine the status of the fuse. It may be difficult, however, to employ the foregoing method after an individual memory device has been diced from the wafer and packaged. This is because the fuse cannot be cut with a laser beam after the memory device has been packaged. Furthermore, the conventional fuse signature circuit of FIG. 1 may be insufficient to apply the high electrical current (for example, several tens of mA) required to electrically cut the fuse.

This difficulty results because in order to cut the fuse 10 by applying a relatively high current to the signature circuit, the size of the NMOS transistors serially connected between the pad 12 and supply voltage Vcc may be required to increase, for example, to have a ratio of channel width and length of about 100:0.7. If the size of the NMOS transistors increases as stated above, it may be more difficult to form multiple signature circuits on the wafer. In addition, the junction capacitance may increase resulting in deterioration of the memory device operation characteristics. Moreover, even if the fuse 10 is electrically cut using the signature circuit of FIG. 1, such use may reduce the reliability of the signature circuit in determining whether or not the corresponding fuse has been cut.

SUMMARY OF THE INVENTION

It is therefore an object of the present invention to provide improved fuse signature circuits for microelectronic devices.

It is another object of the present invention to provide fuse signature circuits for microelectronic devices which allow determination of the state of a fuse after packaging the device.

It is still another object of the present invention to provide fuse signature circuits for microelectronic devices capable of cutting a fuse after packaging the device.

These and other objects are provided according to the present invention by a fuse signature circuit for a microelectronic memory device including a fuse circuit and a sensing circuit. The fuse circuit includes a fuse which can be cut electrically in response to a cut control signal and the fuse circuit generates a fuse state signal indicating that the fuse has been cut. The sensing circuit generates an output signal in response to the fuse state signal. This circuit thus allows a fuse to be cut and checked after packaging of the microelectronic memory device.

In particular, the fuse can be cut in response to electrical energy passed therethrough, and the fuse circuit may further include a transistor serially connected with the fuse and a fuse circuit for generating the fuse state signal. The transistor allows electrical energy from the electrical energy source to pass through the fuse in response to a cut control signal thereby cutting the fuse. A cut control circuit can be used to turn the transistor on responsive to the cut control signal and a master clock signal, and the fuse state circuit may include an inverter connected to a node of the fuse.

The sensing circuit may connect a reference signal to an output pad responsive to the fuse state signal and a signature input signal. This sensing circuit may include first and second transistors connected serially between the reference signal and the output pad. The first and second transistors respectively provide electrical connection in response to the signature output signal and the fuse state signal.

The fuse signature circuit of the present invention thus allows fuses to be cut on a microelectronic memory device after packaging. This circuit also allows the status of individual fuses on a packaged memory device to be checked after packaging. Accordingly, memory devices can be easily sorted after packaging according to selected modes of operation which are determined by cutting fuses.

BRIEF DESCRIPTION OF THE DRAWINGS

FIG. 1 is a schematic circuit diagram illustrating a fuse signature circuit for an integrated circuit memory device according to the prior art.

FIG. 2 is a schematic circuit diagram illustrating an electrical fuse circuit according to the present invention.

DETAILED DESCRIPTION

Figure 3:
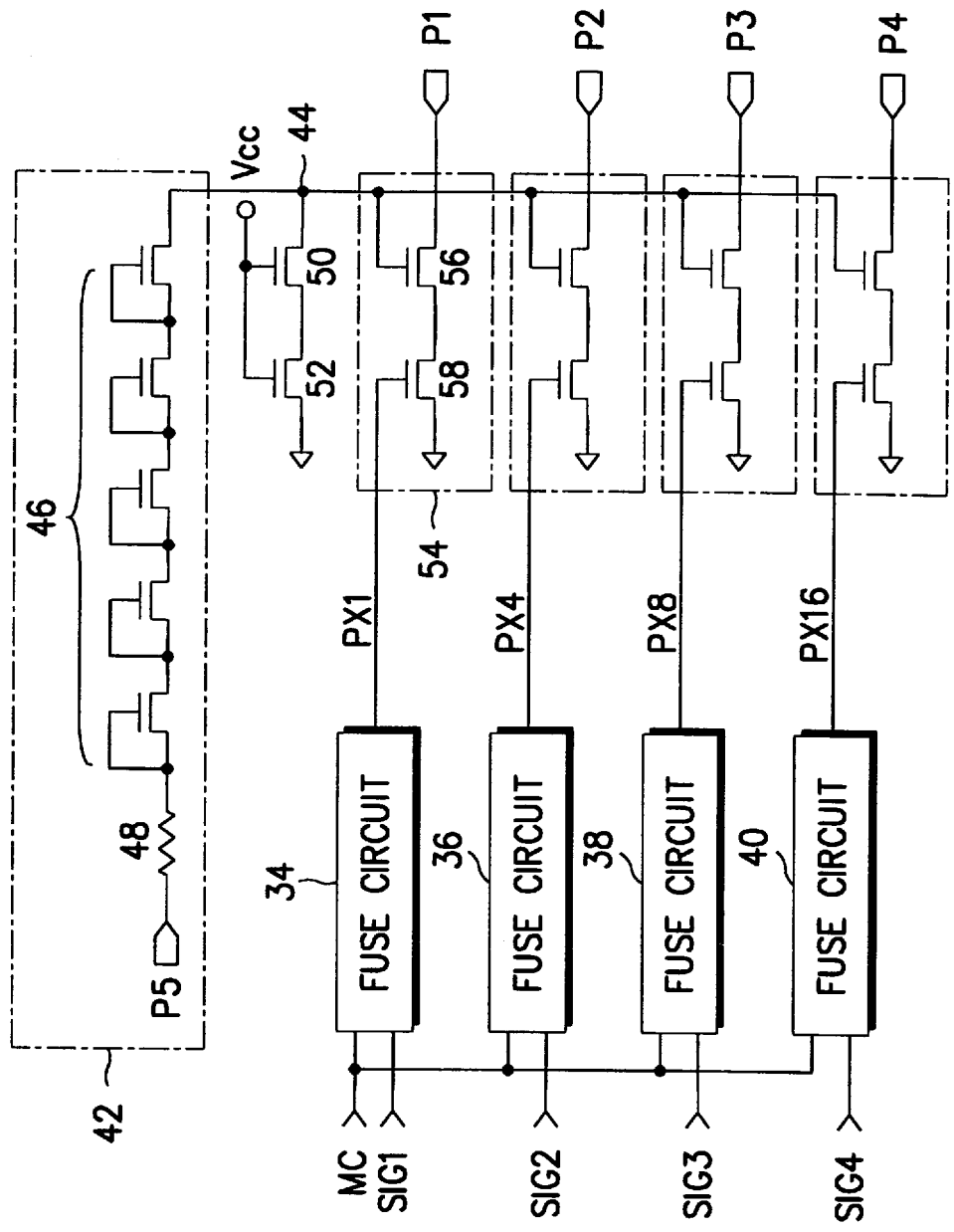
FIG. 3 is a schematic circuit diagram illustrating a fuse signature circuit of an integrated circuit memory device according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

A fuse circuit according to the present invention is illustrated in FIG. 2. A first node of the fuse 20 is connected to the drain of PMOS transistor 22. The source of PMOS transistor 22 is connected to the supply voltage Vcc, and the gate of the transistor 22 is connected to ground potential. The second node of the fuse 20 is connected to the drain of NMOS transistor 24. The source of the NMOS transistor 24 is connected to a reference voltage such as ground potential Vss, and this transistor receives a cut control signal at its gate.

An output node of NOR gate 26 generates the cut control signal in response to a master clock MC and a fuse selection signal SIGi (wherein i may be 0, 1, 2, 3 . . . ). As shown, the cut control signal is generated when both the master clock MC and the fuse selection signal SIGi are enabled to a logic "low" level. Accordingly, when a supply voltage Vcc is applied to the memory device, and the master clock MC and the fuse selection signal SIGi are enabled to the logic "low" level, the fuse 20 will be cut. In particular, the NOR gate 26 generates a cut control signal responsive to the logic "low" level of the master clock and the fuse selection signal thereby turning the NMOS transistor 24 on. Current thus flows from the supply voltage Vcc through the PMOS transistor 22, the fuse 20, and the NMOS transistor 24 thereby cutting the fuse 20.

When the NOR gate 26 outputs the cut control signal having a logic "high" level, the resulting current through the fuse 20 can have a magnitude on the order of several tens of mA which is sufficient to cut the fuse. Once the fuse 20 has been cut, the input of inverter 30 goes to a logic "low" level. Accordingly, the output of the inverter 30 is driven to a logic "high" level. That is, the cut state signal PXi generated by the inverter 30 goes to the logic "high" level indicating that the fuse has been cut. In summary, when the master clock signal MC and the fuse selection signal SIGi are enabled at the logic "low" level, a fuse 20 is cut (or blown) and the inverter 30 generates the cut state signal PXi having the logic "high" level.

A fuse signature circuit according to the present invention is illustrated in FIG. 3. The reference numerals 34, 36, 38, and 40 indicate fuse circuits as discussed above with regard to FIG. 2. As previously discussed, when the master clock signal MC and the respective fuse selection signal SIGi are simultaneously enabled to the logic "low" level, a fuse of the respective fuse circuit is cut and the respective output fuse state signal PXi goes to the logic "high" level indicating that that fuse has been cut. The cut state signal PXi from each fuse circuit is provided to a respective sensing circuit 54. For example, when only the fuse selection signal SIG1 to the fuse circuit 34 is enabled to the logic "low" level, only fuse state signal PX1 is driven to the logic "high" level, and fuse state signals PX4, PX8 and PX16 all remain at the logic "low" level.

In order to check the state of the fuses as discussed above, a signature voltage of greater than 5 Vtn is applied to the pad P5 of the bias circuit 42. This signature voltage is transmitted through the resistor 48 to the transistor array 46 where a plurality of NMOS transistors are serially connected in a diode form and thus turned on. The resistor 48 is connected between the pad P5 and a drain of an NMOS transistor to provide protection against electrostatic discharge ESD. When a sufficient signature voltage is applied to the pad P5, the voltage level of bias circuit output node 44 is driven to a logic "high" level. The signal at the bias circuit output node 44 is provided to the gate of the NMOS transistor 56 within the sensing circuit 54 wherein the NMOS transistors 56 and 58 are connected in series. Furthermore, the gate of the NMOS transistor 58 within the sensing circuit 54 is connected to the output of the respective fuse circuit so that the fuse state signal PXi is applied thereto. The source of NMOS transistor 58 is grounded.

Accordingly, a sensing voltage equal to the supply voltage Vcc can be provided to each of the sensing pads P1–P4, and an electrical current path is formed through the channel of the NMOS transistors 56 and 58 to the reference voltage terminal when the transistors are turned on. In particular, the current path is formed when NMOS transistor 58 is turned on as a result of the fuse state signal PXi being driven to the logic "high" level in response to a cut fuse, and when the NMOS transistor 56 is turned on responsive to the bias circuit output having a logic "high" level. Current can thus be sensed when a voltage supplied to a pad Pi and both respective NMOS transistors 56 and 58 are turned on. Accordingly, if only the fuse from fuse circuit 34 has been cut, then current will only be sensed at pad P1.

The mode of operation selected for the memory device can thus be determined by supplying a sufficient voltage to each of pads P1–P5 and monitoring whether current is measured at each pad. In the memory device, the signature circuit can be used to determine whether any fuses have been cut. As will be understood by one having skill in the art, the application of the previously discussed fuse signature circuit and associated fuse circuit can be expanded beyond the determination of memory device operating modes.

NMOS transistors 50 and 52 are used to prevent the bias circuit output node 44 from electrically floating when the supply voltage Vcc is initially applied during power-up of the memory device. These transistors may also reduce noise generated at the bias circuit output node 44 during operation of the memory device.

The fuse signature circuit of the present invention can thus be used to cut fuses electrically within a packaged chip as well as to check whether a particular fuse has been cut. Accordingly, the fuse signature circuit of the present invention allows the sorting of memory devices according to operating modes after packaging and also improves the reliability of the memory device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A fuse signature circuit for a microelectronic device, said fuse signature circuit comprising:
    a fuse circuit comprising a fuse which can be cut electrically in response to a cut control signal, said fuse circuit generating a fuse state signal indicating if the fuse has been cut wherein said fuse can be cut in response to electrical energy passed therethrough, said fuse circuit further comprising,
        a transistor serially connected with said fuse wherein said transistor allows electrical energy from an electrical energy source to pass through said fuse in response to said cut control signal thereby cutting said fuse, and
        a fuse state circuit responsive to an output of said fuse for generating said fuse state signal;
    a sensing circuit which generates an output signal responsive to said fuse state signal; and
    a cut control circuit for turning said transistor on responsive to said cut control signal and a master clock signal.

2. A fuse signature circuit according to claim 1 wherein said fuse state circuit comprises an invertor.

3. A fuse signature circuit according to claim 1 wherein said sensing circuit connects a reference signal to an output pad responsive to said fuse state signal and a signature input signal.

4. A fuse signature circuit for a microelectronic device, said fuse signature circuit comprising:
    a fuse circuit comprising a fuse which can be cut electrically in response to a cut control signal, said fuse circuit generating a fuse state signal indicating if the fuse has been cut; and
    a sensing circuit which generates an output signal responsive to said fuse state signal;
    wherein said sensing circuit connects a reference signal to an output pad responsive to said fuse state signal and a signature input signal; and
    wherein said sensing circuit comprises first and second transistors connected serially between said reference signal and said output pad, wherein said first and second transistors respectively provide electrical connection in response to said signature input signal and said fuse state signal.

5. A fuse signature circuit according to claim 1 wherein said microelectronic device is a microelectronic memory device.

6. A fuse signature circuit for a microelectronic device, said fuse signature circuit comprising:
    a fuse which can be cut in response to electrical energy passed therethrough;
    a transistor serially connected with said fuse wherein said transistor allows electrical energy from an electrical energy source to pass through said fuse in response to a cut control signal thereby cutting said fuse;
    a fuse state circuit for generating a fuse state signal indicating a condition of said fuse; and
    a cut control circuit for turning said transistor on responsive to said cut control signal and a master clock signal.

7. A fuse signature circuit according to claim 6 wherein said fuse state circuit comprises an invertor.

8. A fuse signature circuit according to claim 6 further comprising a sensing circuit which connects a reference signal to an output pad responsive to said fuse state signal and a signature input signal.

9. A fuse signature circuit for a microelectronic device, said fuse signature circuit comprising:
    a fuse which can be cut in response to electrical energy passed therethrough;
    a transistor serially connected with said fuse wherein said transistor allows electrical energy from an electrical energy source to pass through said fuse in response to a cut control signal thereby cutting said fuse;
    a fuse state circuit for generating a fuse state signal indicating a condition of said fuse; and
    a sensing circuit which connects a reference signal to an output pad responsive to said fuse state signal and a signature input signal wherein said sensing circuit comprises first and second transistors connected serially between said reference signal and said output pad, wherein said first and second transistors respectively provide electrical connection in response to said signature input signal and said fuse state signal.

10. A fuse signature circuit according to claim 6 wherein said microelectronic device is a microelectronic memory device.

11. A fuse signature circuit for a microelectronic device, said fuse signature circuit comprising:
    a fuse circuit comprising a fuse which can be cut electrically in response to a cut control signal, said fuse circuit generating a fuse state signal indicating if the fuse has been cut;
    a sensing pad which receives an electrical sensing signal; and
    a sensing circuit which electrically connects said sensing pad with a reference signal in response to said fuse state signal wherein said sensing circuit comprises first and second transistors serially connected between said sensing pad and said reference signal, wherein said first and second transistors respectively provide electrical connection in response to a signature input signal and said fuse state signal.

12. A fuse signature circuit according to claim 11 wherein said fuse can be cut by applying sufficient electrical energy thereto, said fuse circuit further comprising:
    an electrical energy source electrically connected to a first terminal of said fuse;
    a transistor which electrically connects a second terminal of said fuse to a reference voltage in response to said cut control signal thereby allowing electrical energy to flow through and cut said fuse; and
    an invertor which inverts an electrical signal at said second terminal of said fuse to generate said fuse state signal.

13. A fuse signature circuit according to claim 11 wherein said microelectronic device is a microelectronic memory device.

14. A fuse signature circuit for a microelectronic device, said fuse signature circuit comprising:

a fuse circuit comprising a fuse which can be cut electrically in response to a cut control signal, said fuse circuit generating a fuse state signal indicating if the fuse has been cut;

a sensing pad which receives an electrical sensing signal;

a bias circuit which generates a signature output signal responsive to a signature input signal; and a sensing circuit comprising first and second transistors serially connected between said sensing pad and a reference voltage, wherein said first and second transistors respectively provide electrical connection in response to said signature output signal and said fuse state signal.

15. A fuse signature circuit according to claim 14 wherein said bias circuit further comprises:

a bias circuit input pad which receives said signature input signal; and at least one transistor serially connected as a diode between said bias input pad and a gate of said first transistor of said sensing circuit.

16. A fuse signature circuit according to claim 15 wherein said bias circuit further comprises a resistor electrically connected in series with said at least one transistor, said resistor providing protection from electrostatic discharge.

17. A fuse signature circuit according to claim 14 further comprising a float preventing gate circuit which prevents an output terminal of said bias circuit from electrically floating.

18. A fuse signature circuit according to claim 14 wherein said microelectronic device is a microelectronic memory device.

19. A fuse signature circuit according to claim 4, said fuse circuit further comprising:

a fuse circuit transistor serially connected with said fuse wherein said transistor allows electrical energy from an electrical energy source to pass through said fuse in response to said cut control signal thereby cutting said fuse; and a fuse state circuit responsive to an output of said fuse for generating said fuse state signal.

20. A fuse signature circuit according to claim 19 further comprising a cut control circuit for turning said fuse circuit transistor on responsive to said cut control signal and a master clock signal.

21. A fuse signature circuit according to claim 9 further comprising a cut control circuit for turning said transistor on responsive to said cut control signal and a master clock signal.

* * * * *